United States Patent
Nakayama

(10) Patent No.: US 10,901,100 B2
(45) Date of Patent: Jan. 26, 2021

(54) RADIATION DETECTOR AND RADIATION DETECTING DEVICE

(71) Applicant: KABUSHIKI KAISHA TOSHIBA, Minato-ku (JP)

(72) Inventor: Kohei Nakayama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 5 days.

(21) Appl. No.: 16/296,606

(22) Filed: Mar. 8, 2019

(65) Prior Publication Data
US 2020/0033490 A1 Jan. 30, 2020

(30) Foreign Application Priority Data

Jul. 26, 2018 (JP) .................................. 2018-139934

(51) Int. Cl.
| | |
|---|---|
| *G01T 1/26* | (2006.01) |
| *H01L 39/10* | (2006.01) |
| *H01L 39/00* | (2006.01) |
| *G01T 7/00* | (2006.01) |

(52) U.S. Cl.
CPC .................. *G01T 1/26* (2013.01); *G01T 7/00* (2013.01); *H01L 39/005* (2013.01); *H01L 39/10* (2013.01)

(58) Field of Classification Search
CPC ........... G01T 1/26; G01T 7/00; H01L 39/005; H01L 39/10
See application file for complete search history.

(56) References Cited

U.S. PATENT DOCUMENTS

| | | | | |
|---|---|---|---|---|
| 5,641,961 A | * | 6/1997 | Irwin ................... | G01R 33/035 250/336.2 |
| 5,880,468 A | * | 3/1999 | Irwin ................. | G01B 11/0616 250/336.2 |
| 6,907,359 B2 | | 6/2005 | Tanaka et al. | |
| 9,720,104 B2 | | 8/2017 | Nagata et al. | |
| 2001/0042831 A1 | * | 11/2001 | Wood ....................... | G01J 5/12 250/338.1 |
| 2006/0198494 A1 | | 9/2006 | Tanaka et al. | |

(Continued)

FOREIGN PATENT DOCUMENTS

| | | |
|---|---|---|
| JP | 2003-167057 | 6/2003 |
| JP | 2005-098807 | 4/2005 |
| JP | 2006-242664 | 9/2006 |

(Continued)

OTHER PUBLICATIONS

B. L. Zink, et al., "Array-compatible transition-edge sensor microcalorimeter γ-ray detector with 42 eV energy resolution at 103 keV", Applied Physics Letters 89, 124101, 2006, 3 pages.

*Primary Examiner* — Marcus H Taningco
(74) *Attorney, Agent, or Firm* — Oblon, McClelland, Maier & Neustadt, L.L.P.

(57) ABSTRACT

According to an embodiment, a radiation detector includes a plurality of absorbers, a resistor, and a heat bath member. The absorbers absorb radiation. The resistor undergoes a change in resistance according to a change in temperature of the absorbers. The heat bath member is maintained at a temperature at which resistance of the resistor becomes equal to a specific resistance value, and is positioned to be in thermal contact with the resistor. The absorbers are positioned to be in contact with the resistor, and are arranged at a distance from each other.

17 Claims, 5 Drawing Sheets

(56) References Cited

U.S. PATENT DOCUMENTS

2010/0304977 A1* 12/2010 Sadleir .................... G01K 7/16
  505/470

FOREIGN PATENT DOCUMENTS

| | | |
|---|---|---|
| JP | 4080778 | 4/2008 |
| JP | 4314921 | 8/2009 |
| JP | 5017965 | 9/2012 |
| JP | 5540321 | 7/2014 |
| JP | 2016-085164 | 5/2016 |

* cited by examiner

RADIATION DETECTOR AND RADIATION DETECTING DEVICE

CROSS-REFERENCE TO RELATED APPLICATIONS

This application is based upon and claims the benefit of priority from Japanese Patent Application No. 2018-139934, filed on Jul. 26, 2018; the entire contents of which are incorporated herein by reference.

FIELD

Embodiments described herein relate generally to a radiation detector and a radiation detecting device.

BACKGROUND

A radiation detector is known that includes absorbers for absorbing radiation and converting the absorbed radiation into heat; a heat bath positioned to be in thermal contact with the absorbers; and a resistor that undergoes a change in resistance according to a change in temperature of the absorbers. In such a radiation detector, the energy of the incident radiation gets converted into heat in the absorbers, and radiation is detected from the change in resistance of the resistor according to the change in temperature of the absorbers. Meanwhile, it has been disclosed that a superconductor is used as the resistor.

A radiation detector that includes a superconductor as the resistor makes use of the significant change in resistance occurring at the time of superconductive transition of the superconductor. Hence, such a radiation detector is expected to serve as the technology that enables achieving a high energy resolution and a high count rate. However, in a conventional radiation detector, every small change in temperature of the absorbers needs to be accurately detected; and, in order to eliminate the influence of thermal noise on the small change in temperature, the heat bath needs to be maintained at an ultralow temperature equal to or lower than 1 K. Hence, in the conventional technology, the detection accuracy undergoes a decline when the heat bath is not maintained at an ultralow temperature.

DETAILED DESCRIPTION

According to an embodiment, a radiation detector includes a plurality of absorbers, a resistor, and a heat bath member. The absorbers absorb radiation. The resistor undergoes a change in resistance according to a change in temperature of the absorbers. The heat bath member is maintained at a temperature at which resistance of the resistor becomes equal to a specific resistance value, and is positioned to be in thermal contact with the resistor. The absorbers are positioned to be in contact with the resistor, and are arranged at a distance from each other.

Exemplary embodiments of the invention are described below in detail with reference to the accompanying drawings.

First Embodiment

Figure 1:
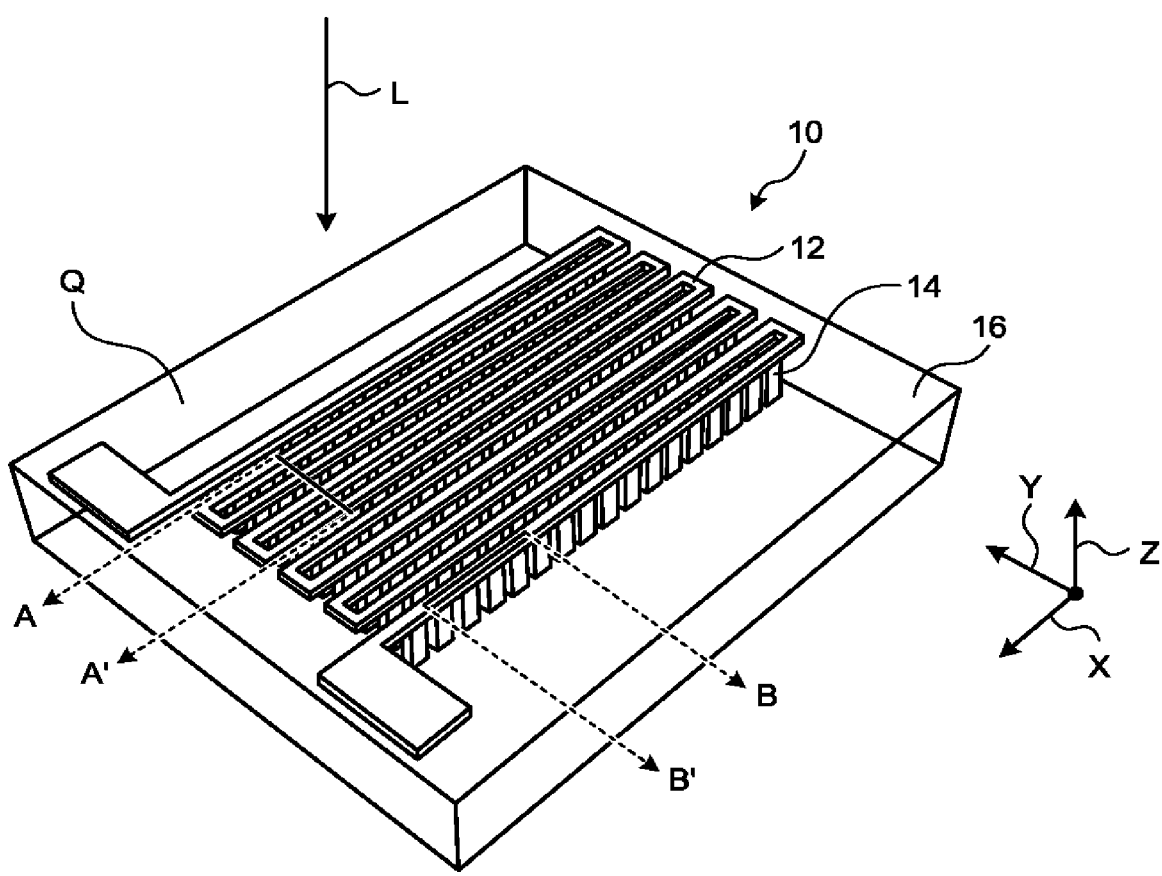
FIG. 1 is a schematic diagram illustrating a radiation detector.

FIG. 1 is a schematic diagram illustrating an example of a radiation detector 10 according to a first embodiment.

The radiation detector 10 includes a resistor 12, absorbers 14, and a heat bath member 16.

The resistor 12 undergoes a change in resistance according to a change in temperature. Herein, resistance implies electrical resistance.

There is no restriction on the shape of the resistor 12. In the first embodiment, it is desirable that the resistor 12 has a long line-like shape running along an incidence plane Q of radiation L in the radiation detector 10, and it is further desirable that the resistor 12 has the shape of meander lines running along the incidence plane Q.

The incidence plane Q is a two-dimensional plane intersecting with the direction of incidence of the radiation L in the radiation detector 10. In FIG. 1 is illustrated an example in which the radiation L is incident from the side of the resistor 12 toward the side of the absorbers 14. However, alternatively, the direction of incidence of the radiation L can be from the absorbers 14 toward the resistor 12 in the radiation detector 10.

In the first embodiment, the explanation is given about an example in which the incidence plane Q is a two-dimensional plane (a two-dimensional plane defined by the direction of an arrow X and the direction of an arrow Y) that intersects with the thickness direction of the radiation detector 10 (the direction of an arrow Z).

The resistor 12 is made of a material that undergoes a change in resistance according to a change in temperature. For example, the resistor 12 is made of a superconductor or made of a material that undergoes metal-insulator transition.

The superconductor that is used as the constituent material of the resistor 12 has the property that the electrical resistance becomes equal to zero at a particular temperature. Herein, the particular temperature is lower than the superconductive transition temperature. More particularly, the superconductor is made of niobium (Nb), or bismuth (Bi), or lead (Pb), or a lead bismuth (PbBi) alloy, or niobium nitride (NbN), or niobium-tin ($Nb_3Sn$), or niobium aluminide ($Nb_3Al$), or magnesium diboride ($MgB_2$), or a yttrium barium copper oxide (YBaCuO) compound, or a bismuth strontium calcium copper oxide (BiSrCaCuO) compound. Of these materials, for the reason of having a high superconductive transition temperature and having the easiness of bonding with the absorber material, it is desirable to use a yttrium barium copper oxide (YBaCuO) compound or a bismuth strontium calcium copper oxide (BiSrCaCuO) compound, and it is particularly desirable to use a bismuth strontium calcium copper oxide (BiSrCaCuO) compound.

In the material that is used as the constituent material of the resistor 12 and that undergoes metal-insulator transition, there occurs phase transition called metal-insulator transition at a particular temperature and a significant change in resistance is seen in the vicinity of the temperature for metal-insulator transition. That is, a material that undergoes metal-insulator transition has the property that, in the vicinity of a particular temperature, the electrical resistance undergoes an extremely large change against only a small change in temperature. More specifically, against only a small change in temperature, an extremely large change in resistance implies a change equal to double or triple or more in the resistivity. The particular temperature implies a temperature lower than the metal-insulator transition temperature at which phase transition from a metal to an insulator occurs. More specifically, the materials that undergo metal-insulator transition include samarium nickel oxide ($SmNiO_3$), or neodymium nickel oxide ($NdNiO_3$), or praseodymium nickel oxide ($PrNiO_3$), or vanadium oxide ($VO_2$), or a layered ruthenate $Ca_2RuO_{4-y}$. Of these materials, for the reason of having a small number of material elements and having the easiness of control in manufacturing, it is particularly desirable to use vanadium oxide ($VO_2$).

Given below is the explanation of the absorbers 14. The absorbers 14 absorb the radiation L, and convert the energy of the absorbed radiation L into heat. That is, the absorbers 14 undergo an increase in temperature according to the amount of energy of the absorbed radiation L.

There is no restriction on the type of the radiation L absorbed by the absorbers 14. For example, the radiation L is at least either beta rays, or heavy particle beams, or alpha rays, or neutron rays, or gamma rays.

In the first embodiment, the radiation detector 10 includes a plurality of absorbers 14.

Figure 2:
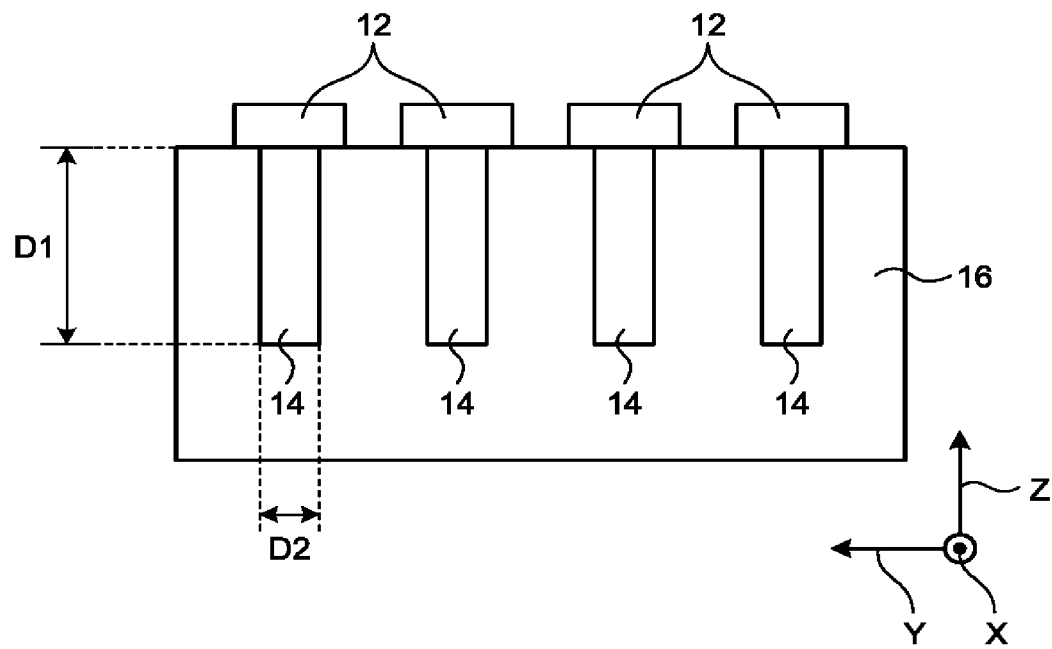
FIGS. 2 to 5 are cross-sectional views of the radiation detector.
Figure 3:
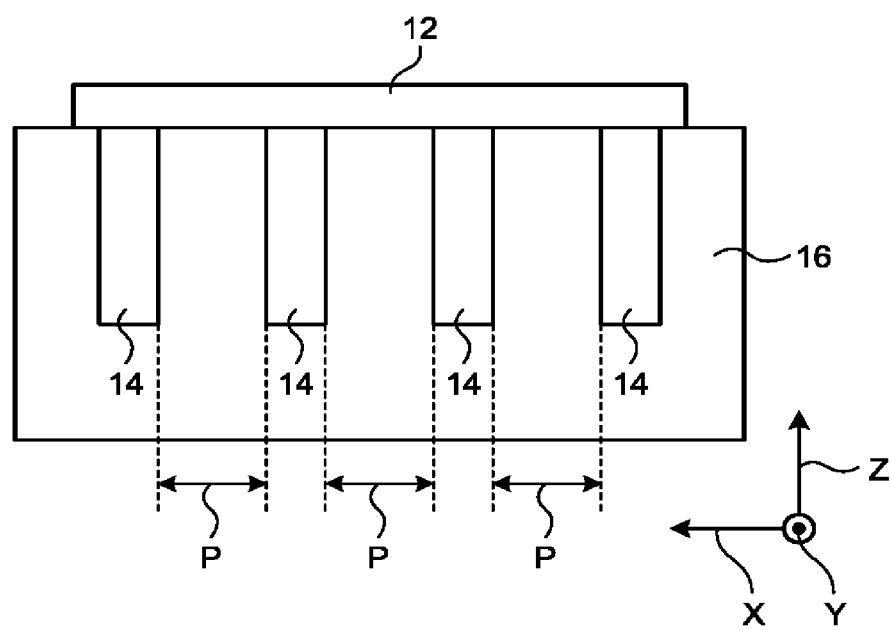

FIG. 2 is an A-A' cross-sectional view of the radiation detector 10 illustrated in FIG. 1. FIG. 3 is a B-B' cross-sectional view of the radiation detector 10 illustrated in FIG. 1.

As illustrated in FIGS. 2 and 3, the absorbers 14 are positioned to be in thermal contact with the resistor 12 and are positioned at a distance from each other.

Regarding the absorbers 14 being positioned in thermal contact with the resistor 12, the absorbers 14 can be positioned at such positions at which the heat obtained by conversion in the absorbers 14 is transferrable to the resistor 12. In the first embodiment, the explanation is given about a case in which each of a plurality of absorbers 14 is positioned to be in physical contact with the resistor 12.

It is desirable that the absorbers 14 are positioned to be in physical surface contact with the resistor 12. More particularly, as illustrated in FIGS. 1 to 3, it is desirable that the absorbers 14 are so positioned that the surface of the resistor 12 facing the absorbers 14 comes in surface contact with the surfaces of the absorbers 14 facing the resistor 12.

As described above, the absorbers 14 are positioned at a distance from each other. More specifically, the absorbers 14 are positioned at a distance from each other along the longitudinal direction of the resistor 12. Thus, the absorbers 14 are positioned at a distance from each other along the longitudinal direction of the resistor 12 having a line-like shape and are positioned to be in contact with the resistor 12.

There is no restriction on the shape of the absorbers 14. However, since it is desirable to have the absorbers 14 positioned to be in surface contact with the resistor 12; it is desirable that the surfaces of the absorbers 14 facing the resistor 12 are planar faces.

More particularly, as illustrated in FIGS. 1 to 3, the absorbers 14 are columnar in shape. Because of the columnar shape, the absorbers 14 represent columns having a cylindrical bottom face or a polygonal bottom face.

As illustrated in FIG. 2, when the absorbers 14 are columnar in shape, it is desirable that the rectangular cut plane formed by cutting the absorbers 14 along the thickness direction of the radiation detector 10 (the direction of the arrow Z) has the aspect ratio (length D1/length D2) to be equal to or greater than 1. Herein, the length D1 represents the length of the absorbers 14 in the thickness direction (the direction of the arrow Z). The length D2 is the maximum length of the absorbers 14 in the width direction (the direction of the arrow Y or the direction of the arrow X).

Figure 4:
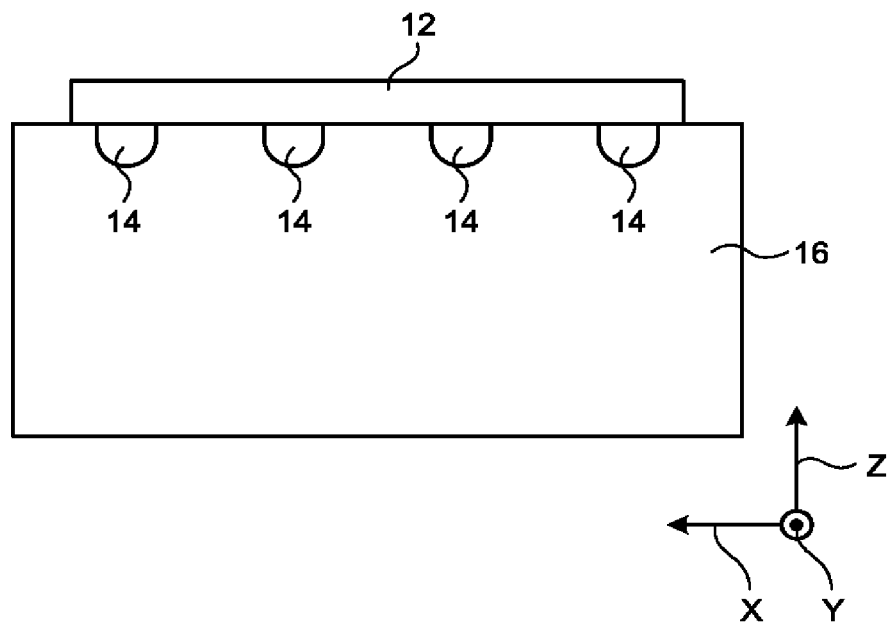
Figure 5:
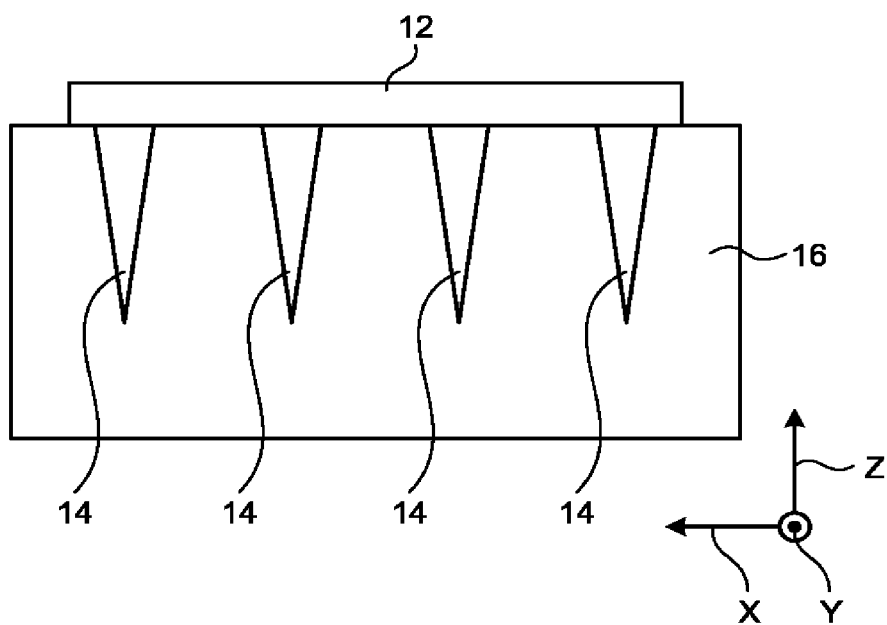

Meanwhile, as there is no restriction on the shape of the absorbers 14, it is possible to have the absorbers 14 in some other shape. In FIGS. 4 and 5 are illustrated examples of B-B' cross-section of the radiation detector 10 illustrated in FIG. 1. For example, the absorbers 14 can have a hemispherical shape (see FIG. 4) or can have the shape of trigonal pyramids (see FIG. 5).

Returning to the explanation with reference to FIG. 3, it is desirable that the absorbers 14 installed in the radiation detector 10 have the same cubic volume. Moreover, it is desirable that the absorbers 14 have the same shape.

The distance between two neighboring absorbers 14 is not limited to a distance P. For example, either the same distance P can be maintained between two neighboring absorbers 14 or different distances P can be maintained between two neighboring absorbers 14. The distance P between two neighboring absorbers 14 indicates the distance between those neighboring absorbers 14 in the longitudinal direction of the resistor 12 (the direction of the arrow X illustrated in FIG. 3) along which the absorbers 14 are arranged.

Moreover, it is desirable that the total area of the surface of the resistor 12 facing the absorbers 14 (hereinafter, called a first-type total area) is greater than the total area of the surfaces of the absorbers 14 facing the resistor 12 (hereinafter, called a second-type total area).

Regarding the constituent material of the absorbers 14, as long as the constituent material absorbs the radiation L and converts the energy of the absorbed radiation L into heat, any constituent material can be used.

For example, the constituent material of the absorbers 14 can be lead (Pb), a lead (Pb) alloy, bismuth (Bi), a bismuth (Bi) alloy, copper (Cu), a copper (Cu) alloy, silver (Ag), or a silver (Ag) alloy; or can be the material having the same composition as the resistor 12. Of these constituent materials, for the reason of radiation absorption efficiency, it is particularly desirable to use lead (Pb), or a lead (Pb) alloy, or bismuth (Bi), or a bismuth (Bi) alloy.

Returning to the explanation with reference to FIG. 1, the following explanation is given about the heat bath member 16.

The heat bath member 16 is maintained at a certain temperature. More specifically, the heat bath member 16 is maintained at a temperature at which the resistance (electrical resistance) of the resistor 12 becomes equal to a specific resistance value. Herein, using an external device having the cooling function, the heat bath member 16 can maintained at a temperature at which the resistor 12 has the specific resistance value. When the constituent material of the resistor 12 is a superconductor, the specific resistance value indicates the electrical resistance value equal to $0\Omega$ or lower than $1\Omega$. In that case, it is desirable that the specific resistance value is equal to $0\Omega$ or is equal to or lower than the detection limit. When the constituent material of the resistor 12 is a material that undergoes metal-insulator transition, the specific resistance value indicates the electrical resistance value equal to or lower than 1 k$\Omega$. It is desirable that the specific resistance value is lower than 1 k$\Omega$ and is equal to or higher than $10\Omega$.

The temperature at which the resistance (the electrical resistance) of the resistor 12 becomes equal to the specific resistance value is defined according to the constituent material of the resistor 12. When the constituent material of the resistor 12 is a superconductor, the temperature at which the resistance (the electrical resistance) of the resistor 12 becomes equal to the specific resistance value is lower than the superconductive transition temperature of the superconductor constituting the resistor 12. Moreover, when the constituent material of the resistor 12 is a material that undergoes metal-insulator transition, the temperature at which the resistance (the electrical resistance) of the resistor 12 is lower than the metal-insulator transition temperature of the material that constitutes the resistor 12 and that undergoes metal-insulator transition.

The heat bath member 16 is positioned to be in thermal contact with the resistor 12. The definition of the positioning for thermal contact is identical as explained earlier. In the first embodiment, the heat bath member 16 is positioned to be in physical contact with at least some part of the resistor 12.

For example, as illustrated in FIG. 2, the heat bath member 16 is positioned to be in physical contact with that surface in the resistor 12 which faces the absorbers 14. Herein, as long as at least some part of the heat bath member 16 is in contact with the resistor, it serves the purpose.

It is desirable that at least some part of the heat bath member 16 is in contact with the resistor 12 and the absorbers 14. Moreover, the heat bath member 16 can be positioned to be in contact with the resistor 12 and the absorbers 14 in such a way that the resistor 12 and the absorbers 14 are entirely covered from outside by the heat bath member 16.

As long as the constituent material of the heat bath member 16 enables maintaining the temperature as described earlier, there is no restriction on the constituent material. For example, the constituent material of the heat bath member 16 can be alumina, magnesium oxide (MgO), or sapphire; and it is particularly desirable to use alumina.

Given below is the explanation of an exemplary manufacturing method for manufacturing the radiation detector 10.

For example, on an alumina substrate serving as the heat bath member 16, a plurality of holes having the diameter of 0.5 μm and having the depth of 0.5 μm are formed at the distance P, which is equal to or smaller than 0.5 μm, from each other. Then, for example, lead (Pb) is inserted in the holes thereby resulting in the formation of the absorbers 14.

Subsequently, on the two-dimensional plane of the heat bath member 16 having the absorbers 14 formed thereon, a niobium (Nb) electrode having the line width of 1 μm is formed in the shape of meander lines, thereby resulting in the formation of the resistor 12. At that time, the absorbers 14 are arranged at a distance from each other along the long direction of the resistor 12, and the resistor 12 is positioned to be in contact with each absorber 14. As a result of these processes, the radiation detector 10 illustrated in FIG. 1 gets manufactured.

Given below is the explanation of the actions of the radiation detector 10 having the configuration described above.

When the radiation L falls on the radiation detector 10, at least one of a plurality of absorbers 14 converts the energy of the incident radiation L into heat. Then, the heat of the concerned absorber 14 is transferred to the resistor 12 via the area of contact between the resistor 12 and the concerned absorber 14. That causes a change in the electrical resistance value of the area coming in contact with the heated absorber 14.

Thus, when a change in the electrical resistance value of the resistor 12 is detected, the radiation L gets detected.

Moreover, since the heat bath member 16 is positioned to be in thermal contact with the resistor 12, it becomes possible to shorten the period of time taken by the resistor 12, which has undergone a change in the resistance value due to heat transfer from the absorbers 14, to return to the pre-change specific resistance value.

In the first embodiment, the absorbers 14 are positioned to be in contact with the resistor 12 and are positioned at a distance from each other.

Hence, the heat capacity of the absorbers 14 can be reduced as compared to a conventional configuration. When the heat capacity of the absorbers 14 decreases, even if the radiation L of the same energy is absorbed, the change in temperature of the absorbers 14 can be increased as compared to the conventional absorbers having a large heat capacity. That is, in the radiation detector 10 according to the first embodiment, as compared to the conventional technology, it becomes possible to increase the range of rise in temperature of the absorbers 14 that absorb the energy of the radiation L.

When there is an increase in the range of rise in temperature of the absorbers 14, the heat attributed to a significant change in temperature can be transferred to the resistor 12, thereby resulting in a large change in the resistance value of the resistor 12. Hence, in the radiation detector 10, the radiation L can be detected with high accuracy.

Meanwhile, it is desirable that the resistor 12 and the absorbers 14 have the same constituent material.

Figure 6:
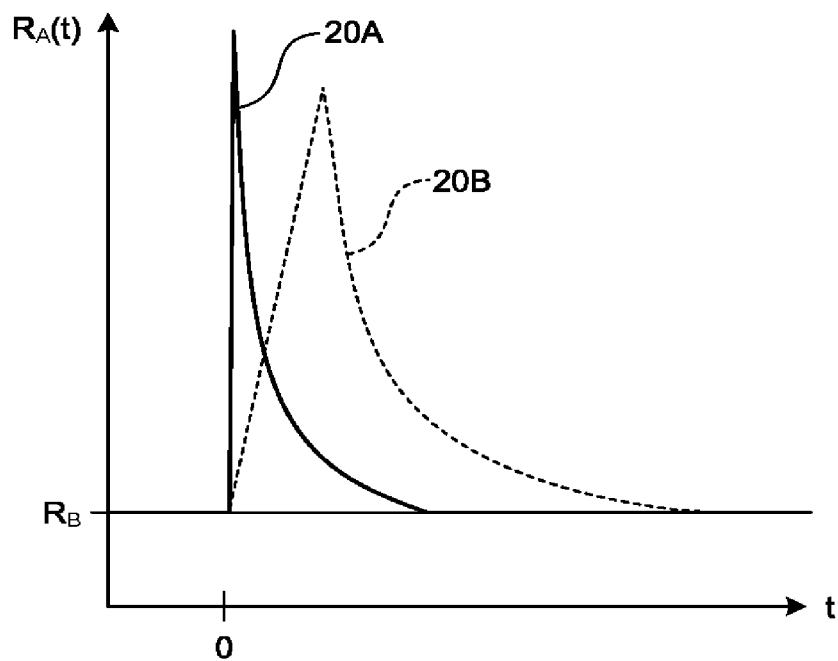
FIG. 6 is a diagram illustrating the changes in the resistance value of a resistor.

FIG. 6 is a diagram illustrating the changes in the resistance value of the resistor 12 when the radiation L falls on the radiation detector 10. A line map 20A indicates the changes in the resistance value of the resistor 12 when the radiation L falls on the radiation detector 10 in which the resistor 12 and the absorbers 14 have the same constituent material. A line map 20B indicates the changes in the resistance value of the resistor 12 when the radiation L falls on the radiation detector 10 in which the resistor 12 and the absorbers 14 have different constituent materials.

As illustrated in FIG. 6, when the resistor 12 and the absorbers 14 have the same constituent material, as compared to the case in which the resistor 12 and the absorbers 14 have different constituent materials, it becomes possible to increase the response speed of a change in the resistance value of the resistor 12 occurring according to a change in temperature of the absorbers 14. Moreover, it becomes possible to shorten the period of time taken by the resistor 12, which has undergone a change in the resistance value, to return to the pre-change resistance value ($R_B$).

Hence, it becomes possible to enhance the resolution of the radiation L in the radiation detector 10, and to detect the radiation L with a higher degree of accuracy.

As explained above, the radiation detector 10 includes the resistor 12, a plurality of absorbers 14, and the heat bath member 16. The absorbers 14 absorb the radiation L. The resistor 12 undergoes a change in resistance according to a change in temperature of the absorbers 14. The heat bath member 16 is maintained at a temperature at which the resistance of the resistor 12 becomes equal to a specific resistance value, and is positioned to be in thermal contact with the resistor 12. The absorbers 14 are positioned to be in contact with the resistor 12 and are positioned at a distance from each other.

Hence, in the radiation detector 10 according to the first embodiment, the heat capacity of the absorbers 14 can be reduced.

As a result, in the radiation detector 10 according to the first embodiment, the radiation L can be detected with high accuracy.

In a conventional thermal-conversion-type detector in which superconductive transition is used, every small change in temperature of the absorbers needs to be accurately detected. Hence, in order to eliminate the influence of thermal noise on the small change in temperature, conventionally the heat bath needs to be maintained at an ultralow temperature equal to or lower than 1 K.

On the other hand, as described above, in the radiation detector 10 according to the first embodiment, as compared to the conventional technology, it is possible to increase the range of rise in temperature of the absorbers 14 that absorb the energy of the radiation L.

For that reason, in the radiation detector 10 according to the first embodiment, in addition to achieving the effect as explained above, the influence of thermal noise can be reduced and the heat bath member 16 can be operated at a higher temperature while maintaining a high energy resolution.

Second Embodiment

In a second embodiment, the explanation is given about a radiation detecting device in which the radiation detector 10 according to the first embodiment is installed.

Figure 7:
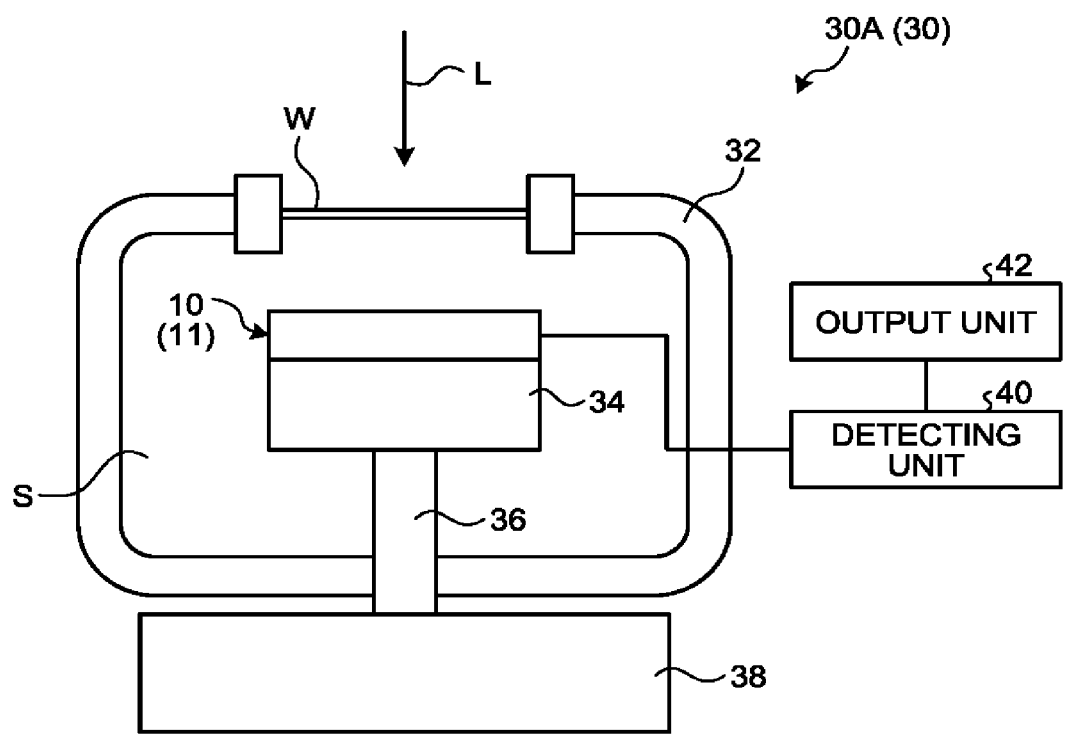
FIGS. 7 to 9 are schematic diagrams illustrating examples of a radiation detecting device.

FIG. 7 is a schematic diagram illustrating an example of a radiation detecting device 30A. The radiation detecting device 30A is an example of a radiation detecting device 30.

The radiation detecting device 30A includes a radiation detecting element 11, a container 32, a cooling member 34, a connecting member 36, a Cry cooler 38, a detecting unit 40, and an output unit 42.

The container 32 is a vacuum chamber formed by creating a vacuum in a space S present inside the container 32. In the container 32, an inlet window W is formed for the transmission of the radiation L. Thus, the radiation L enters the container 32 via the inlet window W.

In the container 32, the cooling member 34 and the radiation detecting element 11 are disposed. The radiation detecting element 11 includes the radiation detector 10. In the second embodiment, the explanation is given about an example in which the radiation detecting element 11 is configured with a single radiation detector 10.

In the radiation detector 10 disposed in the container 32, it is assumed that the absorbers 14 are made of lead (Pb) and the resistor 12 is made of niobium (Nb). Moreover, in the resistor 12, a niobium (Nb) electrode having the line width of 1 μm is formed in the shape of meander lines. The absorbers 14 are formed when, on an alumina substrate serving as the heat bath member 16, a plurality of holes having the diameter of 0.5 μm and having the depth of 0.5 μm are formed at the distance P, which is equal to or smaller than 0.5 μm, from each other. The absorbers 14 are positioned to be in contact with the resistor 12.

The cooling member 34 is meant for cooling the heat bath member 16 of the radiation detector 10. The radiation detector 10 is disposed in the container 32 in such a way that the heat bath member 16 of the radiation detector 10 makes contact with the cooling member 34. Consequently, the cooling member 34 cools the heat bath member 16 of the radiation detector 10.

The cooling member 34 is cooled by the Cryocooler 38, which is disposed on the outside of the container 32, via the connecting member 36. In the second embodiment, the cooling member 34 is cooled to a temperature of about 10 K that is lower than the superconductive transition temperature of the resistor 12 made of niobium (Nb). Subsequently, when disposed to be in contact with the cooling member 34 that is cooled to a temperature of about 10 K, the heat bath member 16 of the radiation detector 10 is maintained at a temperature of about 10 K (that is, at a temperature lower than the superconductive transition temperature of the resistor 12).

The detecting unit 40 is electrically connected to the resistor 12 of the radiation detector 10. The detecting unit 40 detects resistance signals indicating the changes in resistance of the resistor 12 of the radiation detector 10.

For example, when the constituent material of the resistor 12 is a superconductor, the change in resistance at the time of detection is, for example, from 1 mΩ to 10Ω. Alternatively, for example, when the constituent material of the resistor 12 is a material that undergoes metal-insulator transition, the change in resistance at the time of detection is, for example, 10Ω to 1Ω. The detecting unit 40 detects a resistance signal indicating such a change in resistance.

For example, assume that gamma ray photons of about 1 MeV are absorbed as the radiation L in one of a plurality of absorbers 14. Then, the temperature of the concerned absorber 14 rises to about 15 K. As a result, the resistor 12 that is made of niobium (Nb) and that was in the superconducting state undergoes partial transition to the normal conducting state, thereby causing resistance. The detecting unit 40 detects, as the detection result regarding the radiation L, resistance signals indicating the change in resistance.

The output unit 42 outputs the detection result obtained by the detecting unit 40. For example, the output unit 42 can be a display device that displays the detection result, or a speaker that outputs a sound indicating the detection result, or a communication device that communicates information indicating the detection result to an external device. Thus, the detection result obtained by the detecting unit 40 is output by the output unit 42.

In this way, in the radiation detecting device 30A according to the second embodiment, the change in resistance detected in the radiation detector 10 is detected as the detection result regarding the radiation L.

Thus, in the radiation detecting device 30A according to the second embodiment, the radiation L can be detected with high accuracy.

Third Embodiment

In a third embodiment, the explanation is given about a radiation detecting device in which the radiation detector 10 according to the first embodiment is installed.

Figure 8:
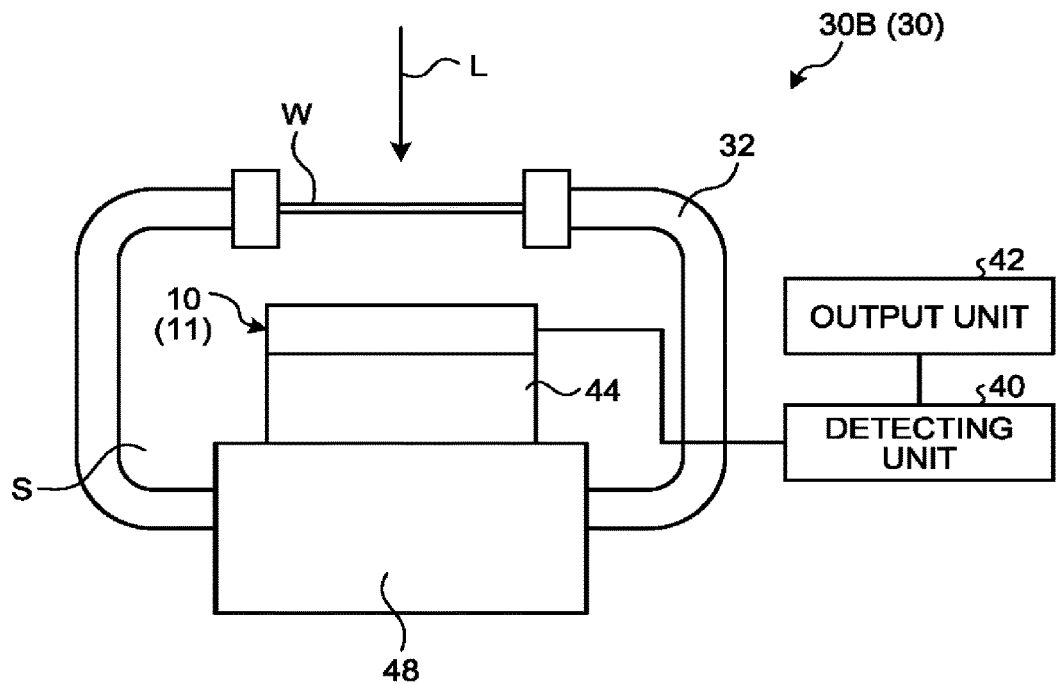

FIG. 8 is a schematic diagram illustrating an example of a radiation detecting device 30B. The radiation detecting device 30B is an example of the radiation detecting device 30.

The radiation detecting device 30B includes the radiation detecting element 11, the container 32, a Peltier device 44, a Peltier device radiator 48, the detecting unit 40, and the output unit 42.

The container 32 is a vacuum chamber formed by creating a vacuum in the space S present inside the container 32. Herein, it is desirable that the container 32 also has a thermal insulation function for insulating the heat present inside the container 32 from the outside of the container 32. In an identical manner to the second embodiment, in the container 32, the inlet window W is formed for the transmission of the radiation L. Thus, the radiation L enters the container 32 via the inlet window W.

In the container 32, the Peltier device 44 and the radiation detecting element 11 are disposed. The radiation detecting element 11 includes the radiation detector 10. In the third embodiment, the explanation is given about an example in which the radiation detecting element 11 is configured with a single radiation detector 10.

In the third embodiment, in the radiation detector 10 disposed in the container 32, it is assumed that the absorbers 14 are made of lead (Pb) and the resistor 12 is made of samarium nickel oxide ($SmNiO_3$) that undergoes metal-insulator transition at the normal temperature. Apart from that, the configuration and the shape of the resistor 12 and the shape and the positioning of the absorbers 14 is identical to the second embodiment.

The Peltier device 44 is meant for cooling the heat bath member 16 of the radiation detector 10 to the temperature of 300 K. The radiation detector 10 is disposed in the container 32 in such a way that the heat bath member 16 of the radiation detector 10 makes contact with the Peltier device 44. Consequently, the Peltier device 44 cools the heat bath member 16 of the radiation detector 10. Moreover, the Peltier device radiator 48 is disposed to be in contact with the Peltier device 44 for the purpose of causing heat release from the Peltier device 44. When the configuration illustrated in FIG. 8 is adapted, the changes in resistance of the radiation L, which is detected in the radiation detector 10, can be detected with high accuracy. Moreover, the operations can be performed by maintaining the temperature of the radiation detector 10 at the normal temperature (of about 300 K).

Fourth Embodiment

In a fourth embodiment, the explanation is given about the radiation detecting device 30 that includes the radiation detecting element 11 in which the radiation detectors 10 according to the first embodiment are arranged in a three-dimensional array.

Figure 9:
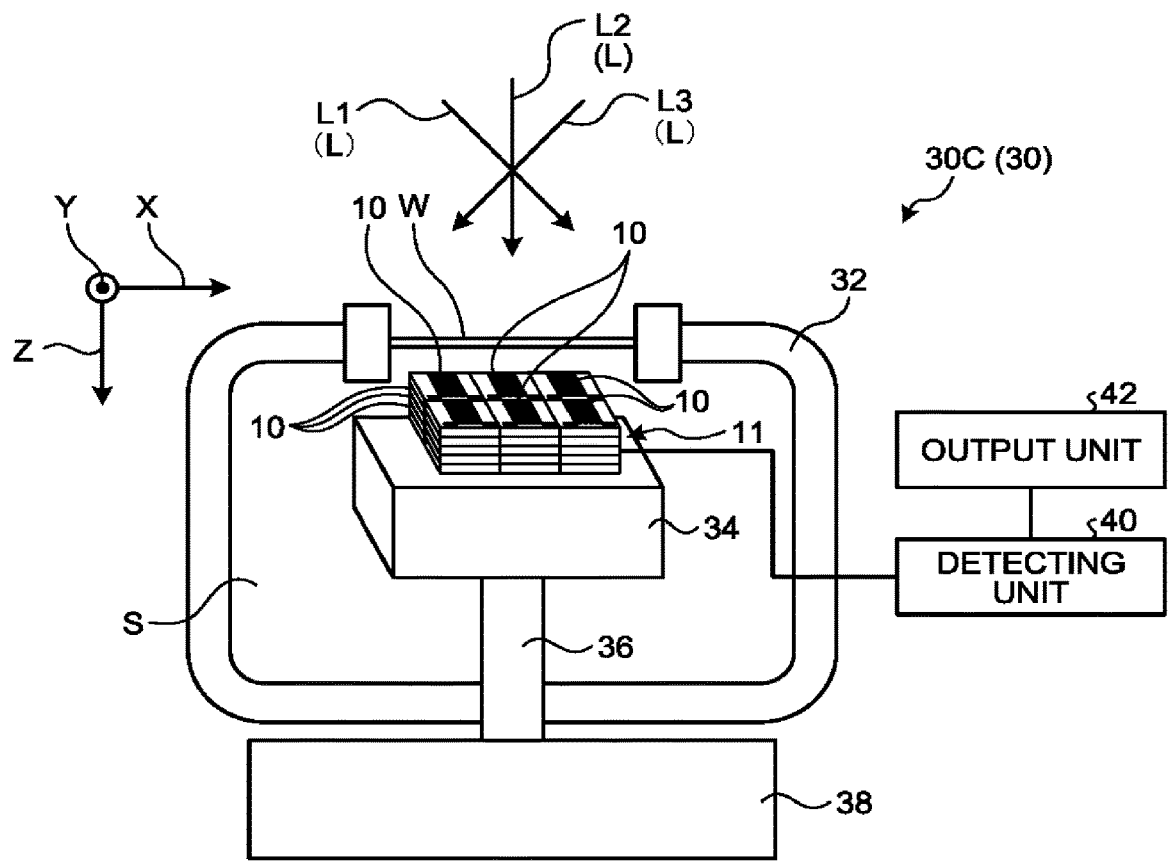

FIG. 9 is a schematic diagram illustrating an example of a radiation detecting device 30C. The radiation detecting device 30C is an example of the radiation detecting device 30.

The radiation detecting device 30C includes the radiation detecting element 11, the container 32, the cooling member 34, the Cryocooler 38, the detecting unit 40, and the output unit 42. Herein, the container 32, the cooling member 34, the Cryocooler 38, the detecting unit 40, and the output unit 42 are identical to the second embodiment (see FIG. 7).

In the fourth embodiment, the radiation detecting element 11 includes a plurality of radiation detectors 10. More specifically, the radiation detecting element 11 includes a plurality of radiation detectors 10 arranged in a three-dimensional array.

More particularly, as illustrated in FIG. 9, a plurality of radiation detectors 10 is arranged in a three-dimensional manner along the thickness direction of the radiation detectors 10 (the direction of the arrow Z) and along the two-dimensional plane (a two-dimensional plane defined by the direction of the arrow X and the direction of the arrow Y) that runs along the incidence plane of the radiation L (see the incidence plane Q illustrated in FIG. 1).

With such a configuration, from among a plurality of radiation detectors 10 constituting the radiation detecting elements 11, the radiation detectors 10 that are arranged along the directions of movement of the radiation L (radiation L1 to radiation L3), which enter via the inlet window W of the container 32, detect the radiation L.

Hence, the detecting unit 40 is electrically connected to the resistor 12 of each of a plurality of radiation detectors 10 constituting the radiation detecting element 11, so that not only a change in resistance of the radiation L detected in any particular radiation detector 10 is detected but also the position of the radiation detector 10 in which the radiation L is detected is identified. As a result, the direction of movement of the incident radiation L can be detected. Moreover, the position of the radiation detector 10, which detected the radiation L, in the two-dimensional directions (the direction of the arrow X and the direction of the arrow Y) intersecting with the thickness direction of the radiation detectors 10 (the direction of the arrow Z) is identified, so that the position of detection of the radiation L can also be identified.

Thus, in the radiation detecting device 30C according to the fourth embodiment, not only the radiation L can be detected with high accuracy, but the incidence direction of the radiation L can also be detected.

In the fourth embodiment, in the radiation detecting element 11, a plurality of radiation detectors 10 is arranged in a three-dimensional array. However, alternatively, in the radiation detecting element 11, a plurality of radiation detectors 10 can be arranged in a two-dimensional array.

In that case, in the radiation detecting element 11, a plurality of radiation detectors 10 can be arranged in a two-dimensional manner (in the direction of the arrow X and the direction of the arrow Y) along the two-dimensional plane (a two-dimensional plane defined by the direction of the arrow X and the direction of the arrow Y) that runs along the incidence plane of the radiation L (see the incidence plane Q illustrated in FIG. 1).

In that case, the detecting unit 40 can identify the position of any particular radiation detector 10, which detected the radiation L, in the two-dimensional directions (the direction of the arrow X and the direction of the arrow Y) intersecting with the thickness direction of the radiation detectors 10 (the direction of the arrow Z), and can accordingly identify the position of detection of the radiation L.

Meanwhile, there is no restriction on the scope of application of the radiation detector 10 described above in the embodiments. For example, the radiation detector 10 can be applied in various devices meant for detecting the radiation L. More particularly, the radiation detector 10 can be applied in a survey meter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radiation detector comprising:
   a plurality of absorbers arranged at a distance from each other, the absorbers absorbing radiation;
   a resistor positioned to be in thermal contact with the absorbers, the resister undergoing a change in resistance according to a change in temperature of the absorbers; and
   a heat bath member that is maintained at a temperature at which resistance of the resistor becomes equal to specific resistance value, and that is positioned to be in thermal contact with the resistor.

2. The detector according to claim 1, wherein the absorbers have same cubic volume.

3. The detector according to claim 1, wherein the absorbers have same shape.

4. The detector according to claim 1, wherein
the resistor has a long line-like shape running along the incidence plane of radiation, and
the absorbers are arranged at a distance from each other along longitudinal direction of the resistor.

5. The detector according to claim 4, wherein the resistor has shape of meander lines running along the incidence plane.

6. The detector according to claim 1, wherein the resistor is made of a superconductor.

7. The radiation detector according to claim 6, wherein temperature at which resistance of the resistor becomes equal to the specific resistance value is lower than superconductive transition temperature of the superconductor constituting the resistor.

8. The detector according to claim 1, wherein the resistor is made of a material that undergoes metal-insulator transition.

9. The detector according to claim 8, wherein temperature at which resistance of the resistor becomes equal to the specific resistance value is lower than metal-insulator transition temperature of the material constituting the resistor.

10. The detector according to claim 1, wherein the resistor and the absorbers have same constituent material.

11. A radiation detecting device comprising:
a detecting element that includes the radiation detector according to claim 1; and
a detecting unit that detects a resistance signal indicating a change in resistance of the resistor of the radiation detector.

12. The device according to claim 11, wherein the detecting element has a plurality of the radiation detector arranged in a two-dimensional array.

13. The device according to claim 11, wherein the detecting element has a plurality of the radiation detector arranged in a three-dimensional array.

14. The device according to claim 11, wherein, in the radiation detector of the detection element,
the absorbers are positioned to be in contact with the heat bath member, and
a contact area between the absorbers and the resistor is smaller than a contact area between the absorbers and the heat bath member.

15. The device according to claim 11, wherein, in the radiation detector of the detection element,
the heat bath member includes a plurality of holes arranged at a distance from each other, and
the absorbers are inserted one-by-one in the holes of the heat bath member while being in contact with the heat bath member.

16. The detector according to claim 1, wherein
the absorbers are positioned to be in contact with the heat bath member, and
a contact area between the absorbers and the resistor is smaller than a contact area between the absorbers and the heat bath member.

17. The detector according to claim 1, wherein
the heat bath member includes a plurality of holes arranged at a distance from each other, and
the absorbers are inserted one-by-one in the holes of the heat bath member while being in contact with the heat bath member.

* * * * *